United States Patent [19]

Ulmer

[11] 4,048,584

[45] Sept. 13, 1977

[54] INPUT PROTECTION CIRCUIT FOR CMOS OSCILLATOR

[75] Inventor: Richard Walter Ulmer, Austin, Tex.

[73] Assignee: Motorola, Inc., Schaumburg, Ill.

[21] Appl. No.: 745,022

[22] Filed: Nov. 26, 1976

[51] Int. Cl.$^2$ .............................................. H02H 7/20
[52] U.S. Cl. ....................................... 331/62; 361/91; 331/111
[58] Field of Search ............... 307/92, 93, 202; 328/8, 328/9, 10, 11; 330/207 P; 331/62, 108 C, 108 D, 111; 317/33 R

[56] References Cited

U.S. PATENT DOCUMENTS

| | | | |
|---|---|---|---|
| 3,462,697 | 8/1969 | Gilbert | 330/207 P |
| 3,633,093 | 1/1972 | Templeton, Jr. | 330/207 P |
| 3,737,672 | 6/1973 | Hill | 307/202 |
| 3,829,709 | 8/1974 | Maigret | 307/202 R |
| 3,878,483 | 4/1975 | Richardson | 331/108 D |
| 3,931,634 | 1/1976 | Knight | 307/202 R |
| 3,967,295 | 6/1976 | Stewart | 307/202 R |

OTHER PUBLICATIONS

Electronic Engineering, Dec. 1973, pp. 13, 331-108 D.

*Primary Examiner*—John Kominski
*Attorney, Agent, or Firm*—Charles R. Hoffman

[57] ABSTRACT

A two pin CMOS oscillator includes an improved input/protection circuit which includes pairs of back-to-back diodes coupled between the input of an amplifier portion of the oscillator and the two power conductors which energize the oscillator. Provision of the back-to-back diode pairs permits use of an internal timing capacitor coupled between the output and input of the amplifier portion of the oscillator to be partially charged by an external timing resistor to a switching point of the amplifier portion of the oscillator. When the amplifier portion of the oscillator switches, the voltage at the input may be boosted or bootstrapped to voltages considerably beyond the range of voltage between the two voltage conductors. Thus, clipping of the voltage swings at the timing node of the oscillator by the protection circuit is avoided, and improved performance is achieved, especially at high frequencies.

8 Claims, 5 Drawing Figures

INPUT PROTECTION CIRCUIT FOR CMOS OSCILLATOR

BACKGROUND OF THE INVENTION

1. Field of the Invention

The invention relates to oscillator circuit shaving input protection networks.

2. Brief Description of the Prior Art

It is well known that when MOS or CMOS devices are handled, the high impedance gate inputs must be protected from static electricity over-voltages. The breakdown voltage of the gate insulator of typical CMOS devices is approximately 80 volts. Numerous input protection circuits have been utilized to dissipate static electricity over-voltages. Many of these input protection devices have utilized PN diodes in integrated circuit structures. Such protection devices are effective, but in certain instances feedback from the internal portions of an oscillator circuit may be desired to boost the protected node beyond the supply voltage limits. The known protection diode arrangements clamp the protected node to within a diode voltage drop from the supply voltages. Such clamping is undesirable in certain cases and prevents use of certain useful circuit design techniques.

SUMMARY OF THE INVENTION

It is an object of the invention to provide an oscillator which avoids clipping of voltage swings at the timing node of the oscillator by an input protection circuit of the oscillator.

Briefly described, the invention is an oscillator including an amplifier having an input and an output. The amplifier has a switching point, which is the value of input voltage at which the output will switch from one voltage level to an opposite voltage level. The oscillator includes means for coupling an output signal on the output of the amplifier to the input in order to boost the input signal. The oscillator includes a input protection network coupled to the input of the amplifier for producing a high impedance at the input when the input signal is within a predetermined range of voltages. In a preferred embodiment, the amplifier portion includes two CMOS inverters cascaded together. A capacitor is connected between the output of the second inverter and the input of the first inverter. The protective network includes two pairs of back-to-back diodes connected between the input of the amplifier portion and two supply voltage conductors energizing the CMOS inverters.

DESCRIPTION OF THE INVENTION

Figure 3A:
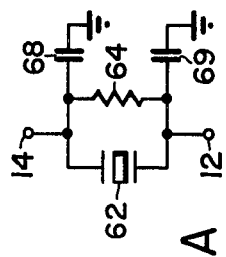
FIG. 3a is a schematic diagram of a circuit including a resistor, a capacitor, and a crystal, which can be connected between two terminals of the circuit of FIG. 1.
Figure 3B:
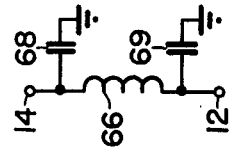
FIG. 3b is a diagram of a LC network which can be connected between two terminals of the circuit of FIG. 1.
Figure 4:
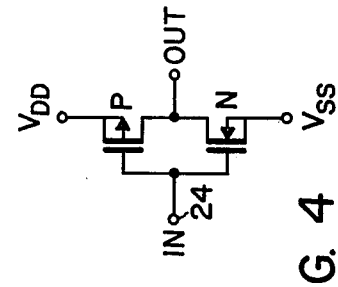
FIG. 4 is a circuit schematic illustrating an implementation of a CMOS inverter circuit may be used in the circuit of FIG. 1.
Figure 1:
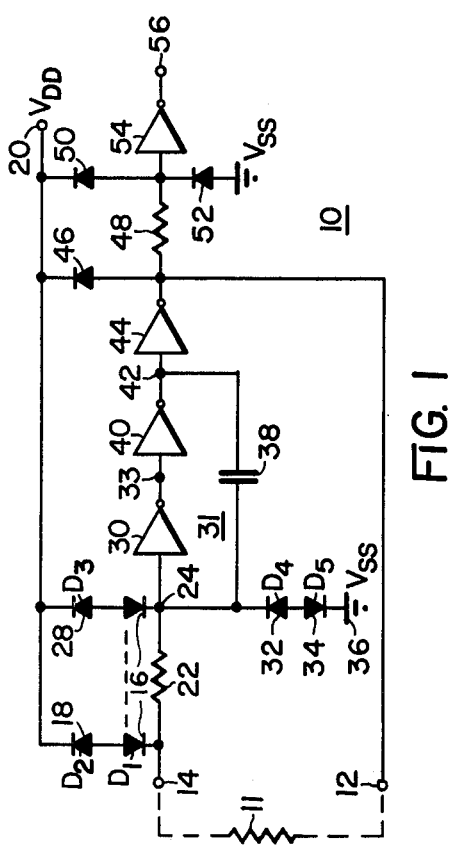
FIG. 1 is a schematic diagram of a presently preferred embodiment of the invention.

Referring to FIG. 1, two-pin CMOS oscillator 10 includes two pins, or leads, 12 and 14, to which an external frequency-controlling network or element can be connected. Those skilled in the art will recognize that the oscillator is called a two-pin oscillator because there are two such frequency-controlling terminals to which an external frequency-controlling device can be connected. For example oscillators which require three external terminals for connection to an external frequency-controlling network are referred to as three-pin oscillators. Oscillator 10 includes an amplifier 31 which includes two CMOS inverters 30 and 40. Inverters 30 and 40 can be implemented as indicated by the schematic drawing in FIG. 4. Oscillator 10 also includes inverter 44, which can be implemented as shown in FIG. 4. Oscillator 10 also includes input protection network 21 to protect the insulators of the MOSFETs of inverters 30, 40 and 44 from being ruptured by overvoltages applied to terminal 14. Static electricity voltages of sufficient magnitude to rupture the gate dielectrics of MOSFETs frequently occur during handling of semiconductor units prior to their installation in a circuit or system. Resistor 11 is connected between terminals 12 and 14. The dotted lines indicate that resistor 11 is external to the package in which the rest of oscillator 10 is packaged. Other frequency controlling elements than resistor 11 could be used however. For example, the crystal circuit of FIG. 3A or the LC circuit of FIG. 3b could be utilized. However, the circuit would then operate in a linear or sinusoidal mode.

Figure 2:
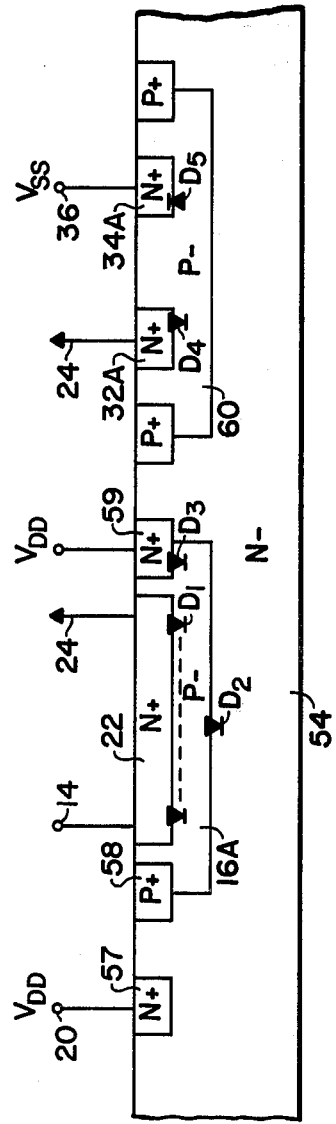
FIG. 2 is a cross-sectional diagram of a portion of an integrated circuit embodying the circuit of FIG. 1 showing the protective network in the semiconductor structure.

Input protection network 21 includes resistor 22 coupled between terminal 14 and node 24. Diode 16, designated D1, has its cathode connected to terminal 14. The dotted line extending from D1 indicates that the diode effect of D1 is distributed along the length of resistor 22. This can be understood by reference to FIG. 2, wherein it is seen that resistor 22 is a N+ region diffused into a P− region 16A, which in turn is formed within a semiconductor substrate 54 of N− conductivity. As indicated by the diode symbols and the dotted line in FIG. 2, D1 is simply the diode formed along the junction between diffused resistor 22 and P− region 16A. Referring back to FIG. 1, diode D2 has its anode connected to the anode of D1. Referring back to FIG. 2, the region of the structure embodying diode D2 (reference numeral 18) is indicated by the diode symbol across the PN junction formed by region 16A and substrate 54. Substrate 54 forms the cathode of diode D2, and is connected to $V_{DD}$ voltage conductor 20. Diode D3 has its anode connected also to the anode of D1, as can be seen in FIG. 1. The diode symbol across the junction between N+ region 59 and P− region 16A in FIG. 2 indicates the physical implementation of D3. The cathode of D3 (reference numeral 28) is connected to $V_{DD}$.

Protection circuit 21 also includes diode D4, reference numeral 32, having its cathode connected to note 24 and its anode connected to the anode of diode D5, reference numeral 34, which has its cathode connected to $V_{SS}$ voltage conductor 36. The preferred implementation of D4 and D5 in a CMOS integrated circuit implementation of the invention are indicated by the diode symbols D4 and D5 in FIG. 2. Amplifier section 31 includes CMOS inverter 30 having its input connected to node 34 and its output connected to the input of CMOS inverter 40, which has its output connected to node 42. Capacitor 38 is connected between node 24 and 42. CMOS inverter 44 has its input connected in node 42 and its output connected to terminal 12. The circuitry including diodes 46, 50, 52, resistor 48, and CMOS inverter 54 provide an output circuit for generating an output pulse at node 56 having a frequency determined by the rest of oscillator circuit 10. Diodes 46, 50 and 52 and resistor 48 provide a conventional input protection circuit to protect the gate insulators of the MOSFETs of the inverter 64 from static electricity over-voltages which may produce over-voltages on terminal 12 during handling of the device.

The operation of the protection circuit 21 of oscillator 10 will first be explained. The desired operation of input protection circuit 21 occurs when oscillator 10 is not connected up to any power supplies, but rather is being manufactured or handled during shipping or otherwise being handled. For a more complete description of the environment of static electricity over-voltages to which electronic components are often subjected during manufacture, testing, and handling, see U.S. Pat. No. 3,911,296.

If a large positive noise voltage pulse happens to be applied to input 14, for example, diode D1 will become reverse biased and will undergo reverse breakdown at approximately 30 volts, for commonly used CMOS manufacturing process. (For this discussion, since the oscillator 10 is not connected to any power supplies, it will be assumed that $V_{SS}$ and $V_{DD}$ are both at 0 volts.) After a short propagation delay occurs through resistor 22 and as it charges up capacitor 38, diode D3 will be forward biased. Therefore, the positive noise voltage pulse will have to charge up the large capacitance associated with $V_{DD}$ conductor 20 as well as the gate capacitance of the MOSFETs in CMOS inverter 30. The capacitance associated with voltage conductor $V_{DD}$ ordinarily would be sufficiently large to dissipate the energy of the positive noise pulse before the voltage at node 24 reaches the dielectric rupture point of the gate dielectrics of the MOSFETs in inverter 30. Similarly, diode D4 will also breakdown at approximately 30 volts, and D5 will be forward biased, so that the positive static electricity pulse also needs to charge up the capacitance associated with the $V_{SS}$ conductor at the same time it charges up the capacitance associated with $V_{DD}$ conductor 20, further increasing the degree of protection provided for the MOSFETs of inverter 30.

If a negative static electricity pulse is applied to terminal 14, diode D1 becomes forward biased, and also diode D4 becomes forward biased. Diodes D3 and D5 undergo a reverse junction breakdown at approximately 30 volts, thereby providing a low impedance from terminal 14 to the capacitances associated with the $V_{DD}$ conductor 20 and $V_{SS}$ conductor 36.

Next, the operation of input protection circuit is analyzed when oscillator 10 is connected to a power supply and is operating. Assume $V_{SS}$ is equal to 0 volts and $V_{DD}$ is equal to 10 volts for the following explanation of operation. Assume that initially node 24 is at 0 volts. Then node 33 will be at $V_{DD}$ volts, or 10 volts. Therefore node 42 will be at 0 volts. Terminal 12 will be at 10 volts. Initially terminal 14 will be at 0 volts. Therefore a charging current will flow through resistor 11 and resistor 22, tending to charge up capacitor 38. Assume also that the switching point of inverter 30 is 5 volts. For a CMOS inverter, it is quite conventional to design the P and N channel MOSFETs such that the output remains at $V_{DD}$ volts until the input voltage reaches $V_{DD}/2$ volts, at which point the output abruptly switches to 0 volts. The charging through resistors 11 and 22 continues until node 24 reaches 5 volts, at which point inverter 30 switches, node 33 goes to 0 volts, node 42 goes to 10 volts, and terminal 12 goes to 0 volts. As node 42 rises rapidly to 10 volts, the voltage across capacitor 38, which has just been charged up to 5 volts, remains substantially constant. Therefore the voltage at node 24 is boosted from $V_{DD}/2$ volts (i.e., 5 volts) to $V_{DD}/2 + V_{DD}$ volts (i.e., 15 volts) as node 42 rises from 0 to $V_{DD}$ volts (i.e., 10 volts). As node 24 rises to a voltage greater than $V_{DD}$ volts, diode D1 becomes reverse biased and also diode D4 becomes reverse biased. Therefore input protection circuit 21 does not interfere with the bootstrapping or boosting of node 24 past $V_{DD}$ volts. At this point, node 12 is at 0, and nodes 24 and 14 are at approximately 15 volts, assuming that resistor 22 is relatively small. A typical value for resistor 22 would be 200 ohms. A typical value for capacitor 38 would be 20 picofarads. A typical value for the external resistor 11 would be 100 kilohms.

Next, the current begins flowing out of capacitor 38 through resistors 22 and 11 to terminal 12, which is at 0 volts. Node 24 starts discharging toward ground, and when it reaches 5 volts, or $V_{DD}/2$ volts, inverter 30 switches, so that node 33 goes to 10 volts, node 42 switches to 0 volts, and node 12 rises to 10 volts. At the point of switching of inverter 30, capacitor 38 has a negative 5 volts across it, so that as node 42 switches from 10 volts to 0 volts, node 24 is bootstrapped from +5 volts to −5 volts by virtue of the substantially constant voltage across capacitor 38. When node 24 is at −5 volts, diodes D1 and D4 will be forward biased, but diodes D2, D3, and D5 will all be reverse biased, so that input protection circuit 21 still presents a high impedance at node 24 and does not interfere with the switching operation of amplifier 31 and its associated frequency determining elements, resistor 11 and capacitor 38.

Previously known input protection circuits would tend to clamp node 24 as it increases above $V_{DD}$ volts or below $V_{SS}$ volts. With the type of oscillator shown in FIG. 10, the bootstrapping action at node 24 unhindered by such clamping action is highly desirable, from the viewpoint of achieving independance of frequency upon power supply voltage.

What is claimed is:

1. An oscillator comprising:
    an amplifier means having an input for amplifying a potential at said input, said amplifier also having an output for conducting said amplified potential;
    first means coupled between said output and said input for electrically coupling a portion of said amplified potential from said output to said input in order to boost said potential at said input; and
    protective means coupled to said input for producing a high impedance at said input when said potential at said input is smaller in magnitude than the magnitude of said boosted potential at said input and for producing a low impedance at said input when said potential at said input is greater in magnitude than the magnitude of said boosted potential at said input.

2. The oscillator as recited in claim 1 wherein said means includes a capacitor coupled between said output and said input.

3. The oscillator as recited in claim 2 having a capacitance at said input, said amplifier having an input switching threshold potential at which said amplifier switches, said oscillator further including second means coupled to said output for inverting said output signal, and third means coupled between said second means and said input for charging said capacitance at said input to said switching threshold potential of said amplifier means.

4. The oscillator as recited in claim 3 wherein said third means includes a resistor means coupled between an output of said second means and said input of said amplifier means for charging said capacitor to a voltage equal to said switching voltage of said amplifier means.

5. The oscillator as recited in claim 4 wherein:
said protective means is coupled to first and second voltage conductors;
said protective means includes first diode means having a cathode coupled to said input, second diode means having a cathode coupled to said input, third diode means having a cathode coupled to said first voltage conductor and an anode coupled to an anode of said first diode means, and fourth diode means having a cathode coupled to said second voltage conductor and an anode coupled to an anode of said second diode means.

6. The oscillator as recited in claim 5 wherein said first diode means includes an elongated region of N type semiconductor material formed in a region of P type semiconductor material, one end of said elongated region being coupled to said input of said amplifier means, another end of said elongated region being connected to said resistor means.

7. The oscillator as recited in claim 3 wherein said amplifier means includes first and second complementary field effect transistor inverters, the input of said first inverter being connected to said input of said amplifier means, the output of said first inverter being connected to an input of said second inverter, the output of said second inverter being connected to said capacitor.

8. The oscillator as recited in claim 7 wherein said second means includes a third CMOS inverter having its input connected to said output of said second complementary field effect transistor inverter and having its output connected to said resistor means.

* * * * *